United States Patent
Tishbi et al.

(10) Patent No.: US 11,962,310 B1
(45) Date of Patent: Apr. 16, 2024

(54) SYNCHRONIZATION BETWEEN DATA AND CLOCK SIGNALS IN HIGH-SPEED INTERFACES

(71) Applicant: Apple Inc., Cupertino, CA (US)

(72) Inventors: Nir Tishbi, Kfar Saba (IL); Ilia Benkovitch, Rishon Lezion (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/944,215

(22) Filed: Sep. 14, 2022

(51) Int. Cl.
| | |
|---|---|
| H03D 3/24 | (2006.01) |
| H03L 7/081 | (2006.01) |
| H03L 7/091 | (2006.01) |
| H03L 7/107 | (2006.01) |
| H04L 7/02 | (2006.01) |
| H04L 7/033 | (2006.01) |

(52) U.S. Cl.
CPC .......... *H03L 7/0818* (2013.01); *H03L 7/091* (2013.01); *H03L 7/1075* (2013.01); *H04L 7/02* (2013.01); *H04L 7/033* (2013.01); *H04L 7/0334* (2013.01)

(58) Field of Classification Search
CPC ..... H03L 7/0818; H03L 7/1075; H03L 7/091; H04L 7/02; H04L 7/033; H04L 7/0334; H04L 7/0337; G06F 1/12
USPC ................ 375/373, 355, 326, 327, 376, 375
See application file for complete search history.

(56) References Cited

U.S. PATENT DOCUMENTS

| | | | |
|---|---|---|---|
| 6,388,480 B1 | 5/2002 | Stubbs et al. | |
| 7,076,377 B2 | 7/2006 | Kim et al. | |
| 7,149,856 B2 | 12/2006 | Garlepp et al. | |
| 7,209,396 B2 | 4/2007 | Schnell | |
| 7,861,105 B2 | 12/2010 | Ke et al. | |
| 8,209,562 B2 | 6/2012 | Defazio et al. | |
| 9,444,470 B2 | 9/2016 | Milijevic | |
| 9,529,379 B2 | 12/2016 | Kwak | |
| 2008/0152057 A1* | 6/2008 | Lee | H04L 7/0337 375/346 |
| 2021/0232203 A1* | 7/2021 | Ware | G06F 1/12 |

OTHER PUBLICATIONS

Jung et al., "A Digital Clock and Data Strobe Aligner for White Calibration of dynamic Random Access Memory," Electronics Letters, vol. 58, No. 7, pp. 268-270, Mar. 2022.

* cited by examiner

*Primary Examiner* — Phuong Phu
(74) *Attorney, Agent, or Firm* — Kligler & Associates

(57) ABSTRACT

A receiver includes an interface, a delay line and circuitry. The interface receives data symbols and a clock signal for strobing the data symbols at selected positions. The delay line produces from the clock signal a middle sampling signal, and early and late sampling signals that respectively precedes and succeeds the middle sampling signal. The circuitry samples the data symbols using the middle, early and late sampling signals to produce early and late error signals. Based on the early and late error signals the delay line delays the middle, early and late sampling signals by separate delay values, so as to track both (i) a phase parameter indicative of a deviation between the middle sampling signal and the selected positions of the data symbols, and (ii) a width parameter indicative of a time duration of the data symbols, and to output the data symbols strobed using the middle sampling signal.

14 Claims, 7 Drawing Sheets

SYNCHRONIZATION BETWEEN DATA AND CLOCK SIGNALS IN HIGH-SPEED INTERFACES

TECHNICAL FIELD

Embodiments described herein relate generally to data communication, and particularly to methods and systems for synchronization between data and clock signals in high-speed interfaces.

BACKGROUND

In synchronous communication, data signals accompanied by a clock signal are sent from a transmitter device to a receiver device over a communication link or bus. The receiver recovers data symbols carried by the data signals by strobing the data signals using the clock signal. For reliable communication, the data signals need to be well aligned with the clock signal.

Methods for synchronizing between data and a clock signal are known in the art. For example, U.S. Pat. No. 7,861,105 describes a method and mechanism for data recovery with phase synchronized clock using interpolator and timing loop module and a data latching circuit. The interpolator can be considered as a programmable delay circuit with a specified delay resolution over the clock period.

U.S. Pat. No. 7,076,377 describes a circuit, apparatus and method that obtain system margin at the receive circuit using phase shifted data sampling clocks while allowing the clock-data recovery (CDR) to remain synchronized with the incoming data stream in embodiments. In an embodiment, a circuit includes first and second samplers to sample a data signal and output data and edge information in response to a data clock signal and an edge clock signal. A phase detector generates phase information in response to the data information and the edge information. A clock phase adjustment circuit generates the data clock signal and the edge clock signal in response to the data information during a synchronization mode. The clock phase adjustment circuit increments a phase of the data clock signal during a waveform capture mode.

SUMMARY

An embodiment that is described herein provides a receiver that includes an interface, a delay line and circuitry. The interface is configured to receive a sequence of data symbols, and to further receive a clock signal for strobing the data symbols at selected positions of the data symbols. The delay line is configured to produce from the clock signal a middle sampling signal, an early sampling signal that precedes the middle sampling signal, and a late sampling signal that succeeds the middle sampling signal. The circuitry is configured to sample the data symbols using the middle sampling signal, the early sampling signal and the late sampling signal to produce an early error signal and a late error signal. Based on the early error signal and on the late error signal, the circuitry is configured to configure the delay line to delay the middle sampling signal, the early sampling signal and the late sampling signal by separate respective delay values, so as to track both (i) a phase parameter indicative of a deviation between the middle sampling signal and the selected positions of the data symbols, and (ii) a width parameter indicative of a time duration of the data symbols, and to output the data symbols strobed using the middle sampling signal.

In some embodiments, the circuitry further includes a phase loop filter, and the circuitry is further configured to track the phase parameter by (i) calculating a difference signal between the early error signal and the late error signal, and (ii) updating a value of the phase parameter by applying the phase loop filter to the difference signal. In other embodiments, the circuitry further includes a width loop filter, and the circuitry is further configured to track the width parameter by (i) applying a nonlinear function to the early error signal and the late error signal to produce a width error signal, and (ii) updating a value of the width parameter by applying the width loop filter to the width error signal. In yet other embodiments, the circuitry is configured to determine a middle delay value for the middle sampling signal based on a value of the phase parameter.

In an embodiment, the circuitry is configured to determine an early delay value for the early sampling signal by setting the early delay value to precede the middle delay value by half the updated value of the width parameter, and to determine a late delay value for the late sampling signal by setting the late delay value to succeed the middle delay value by half the updated value of the width parameter. In another embodiment, the circuitry is configured to produce the early error signal by comparing between a data symbol sampled using the early sampling signal and a data symbol sampled using the middle sampling signal, and to produce the late error signal by comparing between a data symbol sampled using the early sampling signal and a data symbol sampled using the middle sampling signal.

In some embodiments, the receiver resides in a memory device coupled to a memory controller, and the interface is configured to receive the sequence of data symbols and the clock signal while the memory controller writes data to the memory device. In other embodiments, the receiver resides in a memory controller coupled to a memory device, and the interface is configured to receive the sequence of data symbols and the clock signal while the memory controller reads data from the memory device.

There is additionally provided, in accordance with an embodiment that is described herein, a method, including, in a receiver, receiving a sequence of data symbols, and further receiving a clock signal for strobing the data symbols at selected positions of the data symbols. A middle sampling signal, an early sampling signal that precedes the middle sampling signal, and a late sampling signal that succeeds the middle sampling signal are produced from the clock signal. The data symbols are sampled using the middle sampling signal, the early sampling signal and the late sampling signal to produce an early error signal and a late error signal. Based on the early error signal and on the late error signal, the middle sampling signal, the early sampling signal and the late sampling signal are delayed by separate respective delay values, so as to track both (i) a phase parameter indicative of a deviation between the middle sampling signal and the selected positions of the data symbols, and (ii) a width parameter indicative of a time duration of the data symbols. The data symbols are strobed using the middle sampling signal are output.

There is additionally provided, in accordance with an embodiment that is described herein, a transmitter that includes an interface, a delay line and circuitry. The interface is coupled to a receiver via a link, and is configured to transmit to the receiver over the link (i) a sequence of data symbols and preamble symbols, and (ii) a strobing clock signal for strobing the data symbols at selected positions of the data symbols. The delay line is configured to produce from a local clock signal a middle sampling signal serving as the strobing clock signal, an early sampling signal that precedes the middle sampling signal, and a late sampling signal that succeeds the middle sampling signal. The circuitry is configured to sample the data symbols using the middle sampling signal, to sample the preamble symbols using the middle sampling signal, the early sampling signal and the late sampling signal, to receive feedback preamble symbols that were sampled at the receiver using the strobing clock signal, and based on the feedback preamble symbols to produce an early error signal and a late error signal, and based on the early error signal and on the late error signal, to configure the delay line to delay the middle sampling signal, the early sampling signal and the late sampling signal by separate respective delay values, so as to track both (i) a phase parameter indicative of a deviation, at the receiver side, between the middle sampling signal and the selected positions of the data symbols, and (ii) a width parameter indicative of a time duration of the data symbols.

There is additionally provided, in accordance with an embodiment that is described herein, a method, including, in a transmitter, transmitting to a receiver coupled to the transmitter via a link (i) a sequence of data symbols and preamble symbols, and (ii) a strobing clock signal for strobing the data symbols at selected positions of the data symbols. A middle sampling signal serving as the strobing clock signal, an early sampling signal that precedes the middle sampling signal, and a late sampling signal that succeeds the middle sampling signal are produced from a local clock signal. The data symbols are sampled using the middle sampling signal. The preamble symbols are sampled using the middle sampling signal, the early sampling signal and the late sampling signal. Feedback preamble symbols that were sampled at the receiver using the strobing clock signal are received, and based on the feedback preamble symbols an early error signal and a late error signal are produced. Based on the early error signal and on the late error signal, the middle sampling signal, the early sampling signal and the late sampling signal are delayed by separate respective delay values, so as to track both (i) a phase parameter indicative of a deviation, at the receiver side, between the middle sampling signal and the selected positions of the data symbols, and (ii) a width parameter indicative of a time duration of the data symbols.

There is additionally provided, in accordance with an embodiment that is described herein, a memory controller that includes an interface, a delay line and circuitry. The interface is configured to be coupled to a memory device via a link, and to receive from the memory device via the link, (i) a sequence of data symbols, and (ii) a clock signal for strobing the data symbols at selected positions of the data symbols. The delay line is configured to produce from the clock signal a middle sampling signal, an early sampling signal that precedes the middle sampling signal, and a late sampling signal that succeeds the middle sampling signal. The circuitry is configured to sample the data symbols using the middle sampling signal, the early sampling signal and the late sampling signal, to produce an early error signal and a late error signal. Based on the early error signal and on the late error signal, the circuitry is further configured to configure the delay line to delay the middle sampling signal, the early sampling signal and the late sampling signal by separate respective delay values, so as to track both (i) a phase parameter indicative of a deviation between the middle sampling signal and the selected positions of the data symbols, and (ii) a width parameter indicative of a time duration of the data symbols, and to output the data symbols strobed using the middle sampling signal.

There is additionally provided, in accordance with an embodiment that is described herein, a method, including, in a memory controller, receiving from a memory device coupled to the memory controller via a link, (i) a sequence of data symbols, and (ii) a clock signal for strobing the data symbols at selected positions of the data symbols. A middle sampling signal, an early sampling signal that precedes the middle sampling signal, and a late sampling signal that succeeds the middle sampling signal are produced from the clock signal. The data symbols are sampled using the middle sampling signal, the early sampling signal and the late sampling signal, to produce an early error signal and a late error signal. Based on the early error signal and on the late error signal, the middle sampling signal, the early sampling signal and the late sampling signal are delayed by separate respective delay values, so as to track both (i) a phase parameter indicative of a deviation between the middle sampling signal and the selected positions of the data symbols, and (ii) a width parameter indicative of a time duration of the data symbols. The data symbols strobed using the middle sampling signal are output.

These and other embodiments will be more fully understood from the following detailed description of the embodiments thereof, taken together with the drawings in which:

DETAILED DESCRIPTION OF EMBODIMENTS

Overview

Figure 1:
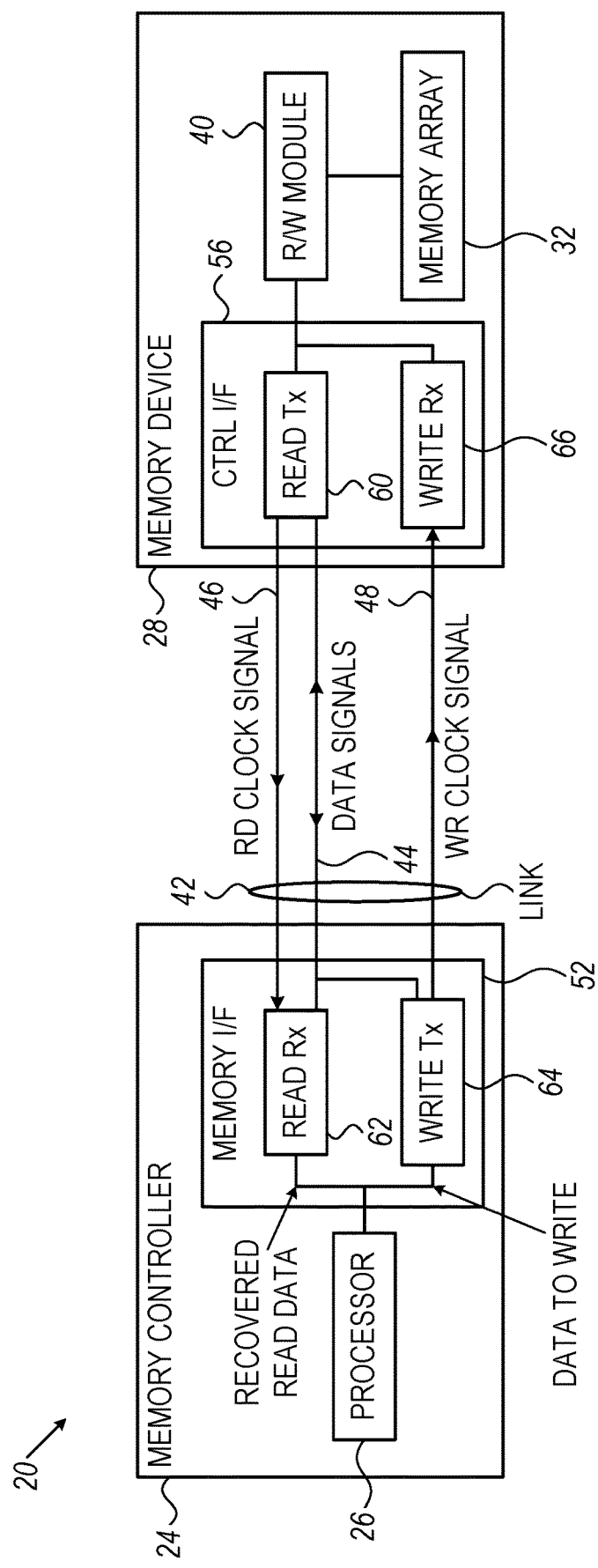
FIG. 1 is a block diagram that schematically illustrates a memory system in which a memory controller communicates with a memory device over a synchronous link, in accordance with an embodiment that is described herein.

A synchronous wire-based link or bus typically comprises one or more data lanes carrying data signals, and a separate clock lane carrying a clock signal.

Embodiments that are described herein provide methods and circuits for achieving improved synchronization between data signals conveying data symbols and a clock signal that strobes the data signals at the receiver. For reliable delivery of the data symbols, the data signals are to be strobed at the receiver side, using the clock signal, at center positions of the data symbols.

In various links such as high-speed links (e.g., having clock frequency on the order of 1200 MHz or more), the timing of the data signals may be misaligned relative to the clock signal, which in turn degrades reliability in recovering the corresponding data symbols at the receiver. Timing misalignment between the data signals (or symbols) and the clock signal strobing the data symbols is also referred to herein as a "timing mismatch."

A timing mismatch may result due to various reasons such as, for example, differences between physical properties of the data lanes and the clock lane, applying different processing paths to the clock signal and to the data signals up to the sampling point, variations in temperature and supply voltage over time that may have different impacts on the data lanes and the clock lane, and the like. Communication reliability over the link typically degrades with increasing the data rate, because the cycle period of the data symbols and the clock signal decreases, making data recovery more susceptible to minor timing misalignments.

In principle, to synchronize between the data signals and the clock signal, the receiver could estimate phase deviations between the clock signal and the center positions of the data symbols, and adjust the sampling instances to compensate for the phase deviations. This scheme, however, fails to take into consideration any uncertainties regarding the boundaries of the data symbols, which specify the width (in terms of time duration) of the data symbols.

In the disclosed embodiments, both a phase parameter specifying a sampling phase deviation and a width parameter related to symbol boundaries are tracked, thereby increasing the reliability in recovering the data symbols compared to tracking only the phase deviation.

Consider an embodiment of a receiver, comprising an interface, a delay line and circuitry. The interface receives a sequence of data symbols, and further receives a clock signal for strobing the data symbols at selected positions of the data symbols. The delay line produces from the clock signal a middle sampling signal, an early sampling signal that precedes the middle sampling signal, and a late sampling signal that succeeds the middle sampling signal. The circuitry samples the data symbols using the middle sampling signal, the early sampling signal and the late sampling signal to produce an early error signal and a late error signal. Based on the early error signal and on the late error signal, the circuitry configures the delay line to delay the middle sampling signal, the early sampling signal and the late sampling signal by separate respective delay values, so as to track both (i) a phase parameter indicative of a deviation between the middle sampling signal and the selected positions of the data symbols, and (ii) a width parameter indicative of a time duration of the data symbols, and outputs the data symbols strobed using the middle sampling signal.

In some embodiments, the circuitry calculates a difference signal between the early error signal and the late error signal and tracks the phase parameter by applying a phase loop filter to the difference signal. In some embodiments, the circuitry further comprises a width loop filter, in which case the circuitry applies a nonlinear function to the early error signal and the late error signal to produce a width error signal, and tracks the width parameter by applying the width loop filter to the width error signal.

In an embodiment, the circuitry determines a middle delay value for the middle sampling signal based on a value of the phase parameter. In such embodiments, the circuitry determines an early delay value for the early sampling signal by setting the early delay value to precede the middle delay value by half the updated value of the width parameter, and to determine a late delay value for the late sampling signal by setting the late delay value to succeed the middle delay value by half the updated value of the width parameter.

In some embodiments, the circuitry produces the early error signal by comparing between a data symbol sampled using the early sampling signal and a data symbol sampled using the middle sampling signal. The circuitry similarly produces the late error signal by comparing between a data symbol sampled using the early sampling signal and a data symbol sampled using the middle sampling signal.

In some embodiments, tracking the phase parameter and the width parameter is carried out at the transmitter, which comprises an interface, a delay line and circuitry. The interface transmits to a receiver over a link (i) a sequence of data symbols and preamble symbols, and (ii) a strobing clock signal for strobing the data symbols at selected positions of the data symbols. The delay line produces from a local clock signal a middle sampling signal serving as the strobing clock signal, an early sampling signal that precedes the middle sampling signal, and a late sampling signal that succeeds the middle sampling signal. The circuitry, samples the data symbols using the middle sampling signal, and samples the preamble symbols using the middle sampling signal, the early sampling signal and the late sampling signal. The circuitry further receives feedback preamble symbols that were sampled at the receiver using the strobing clock signal, and based on the feedback preamble symbols, produces an early error signal and a late error signal. Based on the early error signal and on the late error signal, the circuitry configures the delay line to delay the middle sampling signal, the early sampling signal and the late sampling signal by separate respective delay values, so as to track both (i) a phase parameter indicative of a deviation, at the receiver side, between the middle sampling signal and the selected positions of the data symbols, and (ii) a width parameter indicative of a time duration of the data symbols.

In the disclosed techniques, timing between a clock signal and data symbols transmitted over a link is adjusted dynamically, so as to sample the data symbols at, or very close to, their center positions. To this end, both phase error specifying a deviation of actual sampling position from the symbol center, and the width of the symbol are tracked simultaneously. Using the disclosed embodiments results in sampling accuracy that cannot be achieved by phase tracking alone in high-speed communication. The disclosed embodiments are applicable, for example, in storage system in which a memory controller communicates with a memory device over a wire-based link.

System Description

FIG. 1 is a block diagram that schematically illustrates a memory system 20 in which a memory controller 24 communicates with a memory device 28 over a synchronous link, in accordance with an embodiment that is described herein.

In memory system 20 a processor 26 of memory controller 24 stores data in memory device 28. The memory device comprises a memory array 32 comprising multiple memory cells (not shown). Memory device 28 further comprises a Read/Write (R/W) module 40, which writes data values into the memory cells of memory array 32 and reads data values from the memory cells.

Memory array 32 may comprise any suitable type of volatile or non-volatile memory, such as, for example, Random Access Memory (RAM) or Flash memory. Alternatively, memory device 28 may comprise a magnetic storage device such as a Hard Disk Drive (HDD), or any other suitable storage medium.

Memory system 20 can be used in various host systems and devices, such as in computing devices, cellular phones or other communication terminals, removable memory modules, Solid State Disks (SSD), digital cameras, music and other media players and/or any other system or device in which data is stored and retrieved.

In memory system 20, a link or bus 42 comprises multiple data lanes 44 carrying data signals, a read clock lane 46 carrying a read clock signal, and a write clock lane 48 carrying a write clock signal. Link 42 couples between a memory interface 52 on the memory controller side and a controller interface 56 on the memory device side. The data signals transmitted over data lanes 44 convey data symbols communicated between the memory controller and memory device. Data lanes 44 are also referred to as 'DQ' lanes, whereas clock lanes 46 and 48 are also referred to as 'DQS' lanes.

When processor 26 reads a data unit from the memory device, W/R module retrieves the data unit from the memory array. A read transmitter 60 of the memory device transmits the data unit over the data lanes 44, accompanied by read clock signal sent over the read clock lane 46. On the memory controller side, a read receiver 62 strobes the data signals using the read clock signal to recover the data unit.

When processor 26 writes a data unit to the memory device, a write transmitter 64 of the memory controller transmits the data unit over data lanes 44, accompanied by write clock signal sent over write clock lane 48. A write receiver 66 of the memory device strobes the data signals using the write clock signal to recover the data unit, which W/R module 40 programs to memory array 32.

To ensure data integrity, it is important to strobe the data symbols at the receiver side (e.g., read receiver 62 and write receiver 64) at center instances of the data symbols. A deviation of the actual sampling position from the symbol center is referred to as a "phase error." As noted above, the phase error as well as the positions of symbol boundaries about the center may vary in time. In some embodiments, variations in both phase error and symbol width are tracked, by the receiver or transmitter, as will be described in detail below.

In the example embodiment of FIG. 1, a memory controller communicates with a memory device over a synchronous link. The disclosed embodiments are applicable, however, to any other suitable electronic devices communicating over a synchronous link.

Although FIG. 1 depicts a memory system in which timing alignment between data and clock signals is achieved over a link between a memory controller and a memory device, the embodiments disclosed in the present application, in which both phase error and symbol width are tracked for timing alignment, are applicable to any wire-based interface, such as, for example, a chip-to-chip interface, a chip-to-memory interface and modem links.

An Example Timing Diagram

Figure 2:
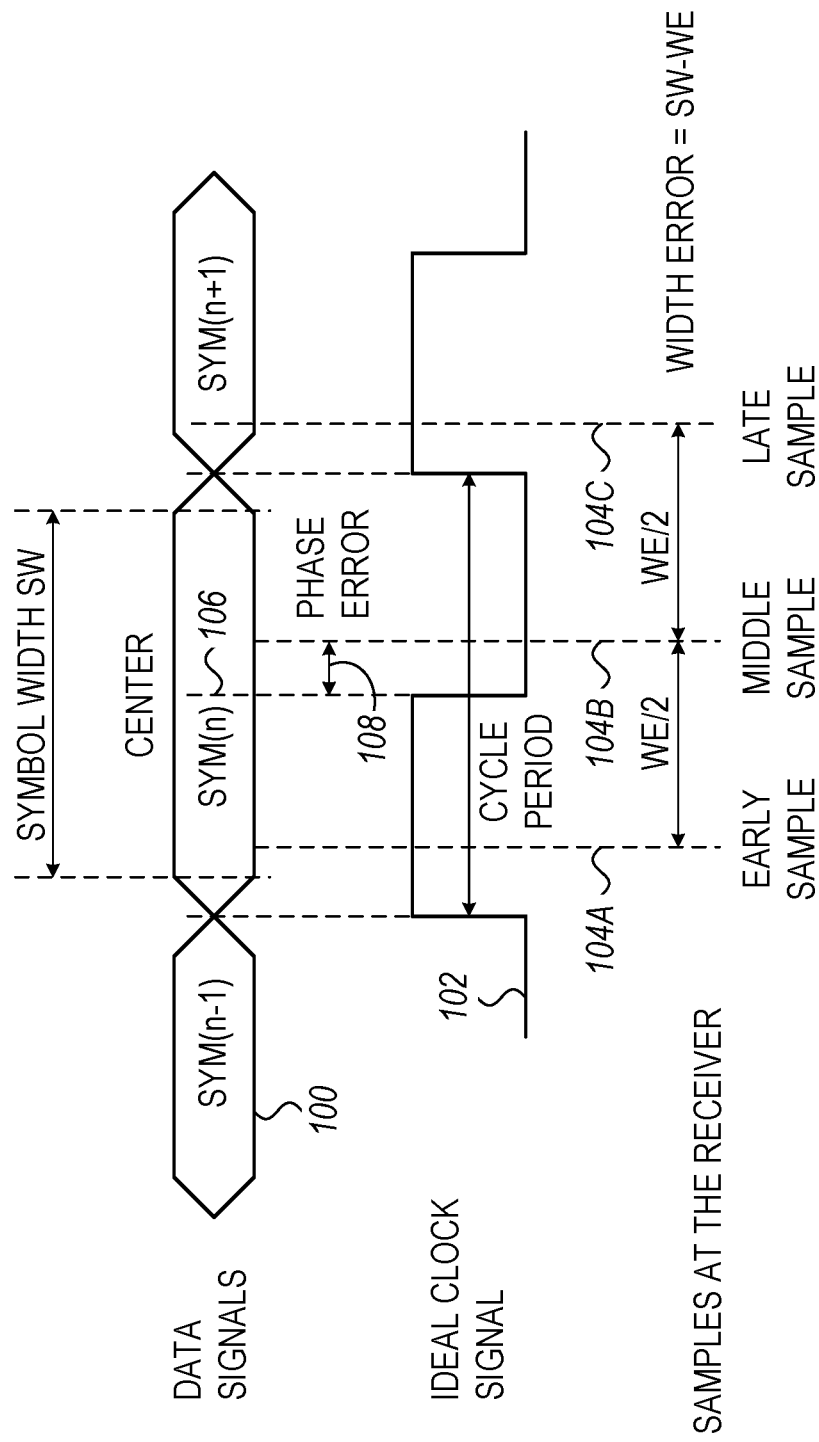
FIG. 2 is a timing diagram that schematically illustrates relationships among data signals, an ideal clock signal and sampling signals, in accordance with an embodiment that is described herein.

FIG. 2 is a timing diagram that schematically illustrates relationships among data signals 100, an ideal clock signal 102 and sampling signals 104A-104C, in accordance with an embodiment that is described herein.

As noted with reference to FIG. 1, data signals 44 convey a sequence of data symbols transmitted over the link. In the present example, the timing diagram depicts data symbols denoted SYM(n−1), SYM(n) and SYM(n+1), wherein 'n' denotes a time index. The symbol width, denoted "SW", is specified by the time positions of the symbol boundaries about the symbol center, which may vary in time. The symbol width corresponds to the period during which the corresponding data signals are stable.

Ideal clock signal 102 is unavailable to the receiver. The ideal clock signal would sample each of the data symbols at a center instance 106, positioned at the falling edge of the ideal clock signal.

As will be described in detail below, the receiver samples the data symbols at an early sample instance 104A, a middle sampling instance 104B and a late sampling instance 104C, resulting in an early sample, a middle sample and a late sample, respectively. The deviation of the middle sampling instance from center instance 106 denotes a phase error 108. The estimated width of the data symbol, at the receiver, is denoted "WE". The width error is therefore given by (SW−WE). In some embodiments, the receiver positions the early sampling instance 104A and the late sampling instance 104C, WE/2 time units earlier than and later than the middle sampling instance 104B, respectively.

In the example of FIG. 2, the middle sampling instance is associated with a positive phase error relative to the center instance. Moreover, in this example the estimated symbol width (WE) is larger than the actual symbol width (SW).

Assuming a zero phase-error, when WE<SW, both the early sample and the late sample of SYM(n) are taken when SYM(n) is stable, and therefore have the same value as the middle sample. On the other hand, when WE>SW, the early and late samples are taken during SYM(n−1) and SYM(n+1) and may thus be equal to or differ from the middle sample.

As will be described below, in some embodiments, the receiver calculates an early error signal between the early and middle samples, and a late error signal between the late and middle samples and uses these error signals for tracking both the sampling phase error and the width of the data symbols.

Tracking Phase Error and Symbol Width at the Receiver

Figure 3:
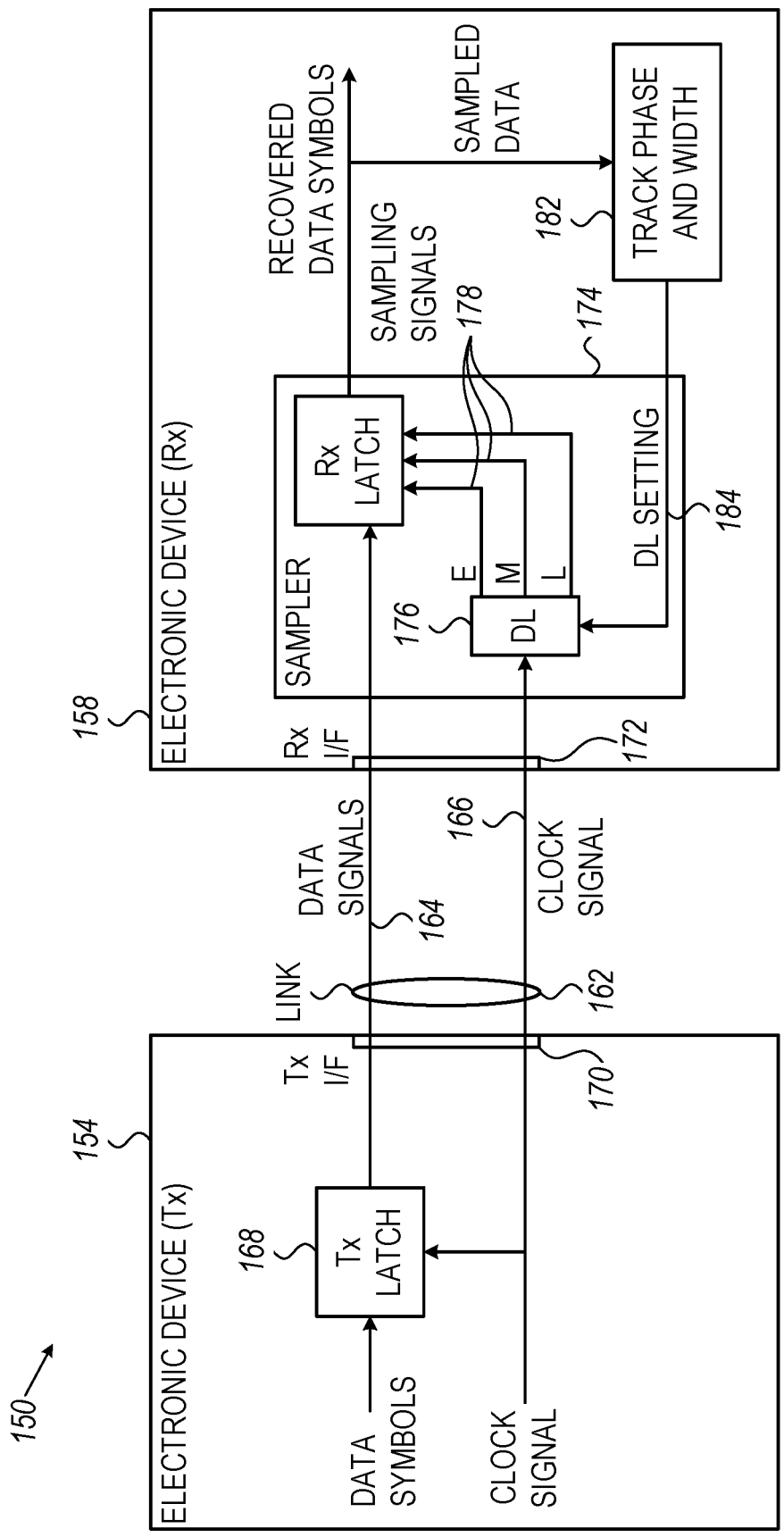
FIG. 3 is a block diagram that schematically illustrates a communication apparatus in which a receiver aligns timing of a clock signal to data symbols by tracking both phase error and symbol width, in accordance with an embodiment that is described herein.

FIG. 3 is a block diagram that schematically illustrates a communication apparatus 150 in which a receiver aligns timing of a clock signal to data symbols by tracking both phase error and symbol width, in accordance with an embodiment that is described herein.

Communication apparatus 150 comprises a transmitter electronic device 154 transmitting data signals to a receiver electronic device 158 over a link 162. The link comprises data lanes 164 and a clock lane 166 for transmitting the data signals and the clock signal, respectively. Clock signal 166 is provided by transmitter 154.

Transmitter 154 comprises a Tx latch 168 coupled to the link via a Tx interface 170. The Tx latch receives data symbols (e.g., from some data source—not shown) and latches them using the clock signal.

The data signals and the clock signal propagate along the data lanes and the clock lane of link 162 to arrive, via a receiver interface 172, at a sampler 174, comprising a Delay Line (DL) 176 and a Rx latch 180.

DL 176 derives from clock signal 166 sampling signals 178, including an early, middle, and late sampling signals denoted 'E', 'M' and 'L', respectively.

Rx latch 180 latches the data symbols conveyed in data signals 164 using each of the early, middle, and late sampling signals. The middle samples contain the recovered data symbols. The early, middle, and late samples latched by Rx latch 180 are processed by a tracker 182, which tracks both phase error and symbol width, as will be described in detail below. Tracker 182 produces a DL setting signal 184 specifying the delays to apply to clock signal 166 for producing sampling signals 178.

Figure 4:
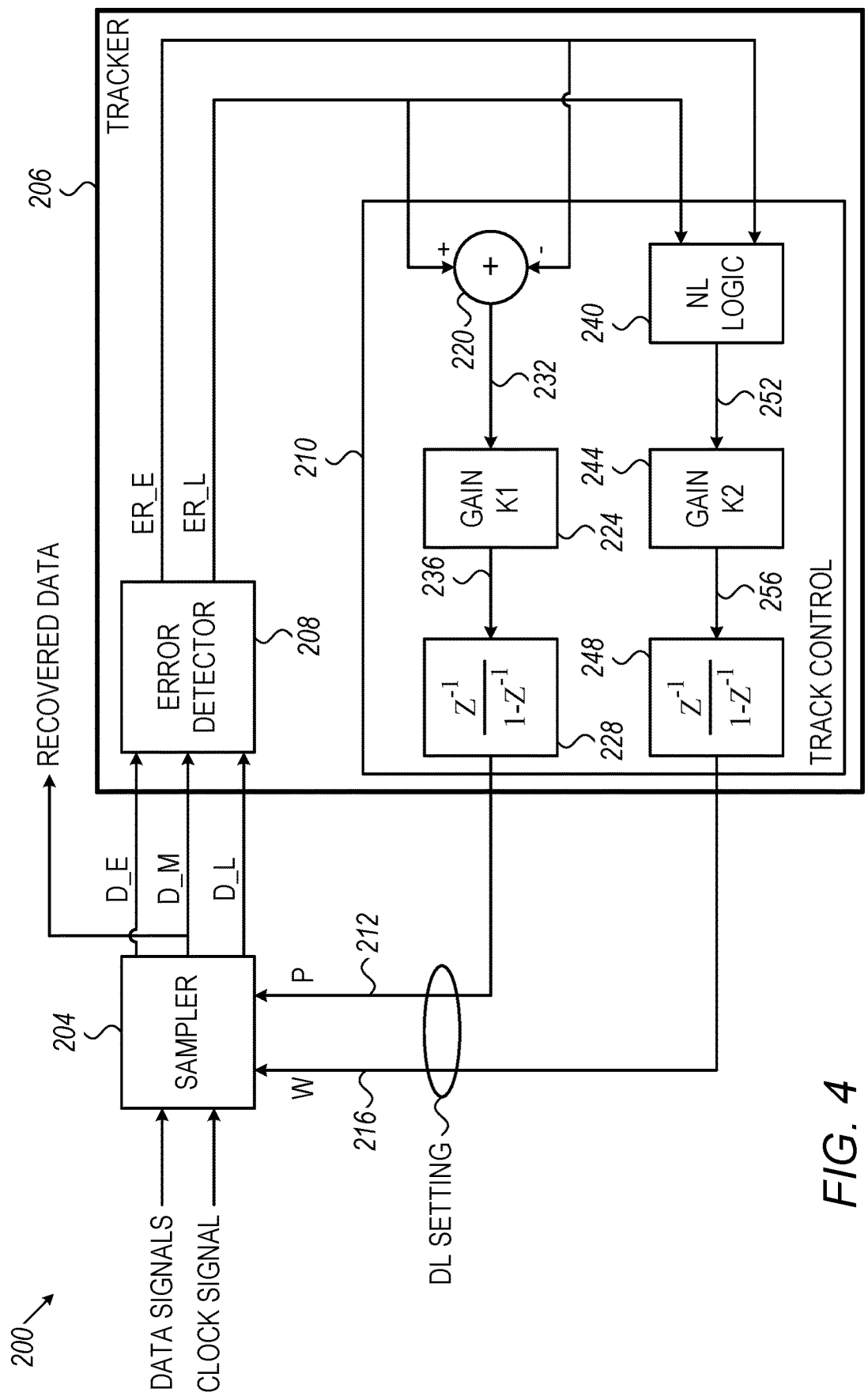
FIG. 4 is a block diagram that schematically illustrates a clock aligner tracking both phase error and symbol width, in accordance with an embodiment that is described herein.

FIG. 4 is a block diagram that schematically illustrates a clock aligner 200 tracking both phase error and symbol width, in accordance with an embodiment that is described herein.

Clock aligner 200 comprises a sampler 204 and a tracker 206. Sampler 204 may be implemented using sampler 174 of FIG. 3, including DL 176 and Rx latch 180. Tracker 206 may be used in implementing tracker 182 of FIG. 3.

Sampler 204 receives data signals and a clock signal. The sampler outputs three samples of the corresponding data symbols, namely an early data sample denoted D_E, a middle data sample denoted D_M and a late data sample denoted D_L. In some embodiments, the sampling signals are produced from the clock signal using a DL and the data samples are latched using the sampling signals using a Rx latch as described in FIG. 3 above.

Tracker 206 comprises an error detector 208 and a track controller 210. Error detector 208 receives the data samples D_E, D_M and D_L from sampler 204. Based on these data samples the tracker produces an early error signal denoted 'ER_E' and a late error signal denoted 'ER_L'. The error signals ER_E is indicative of a difference between the middle sample D_M and the early sample D_E. The error signal ER_L is indicative of a difference between the middle sample D_M and the late sample D_L.

The error signals ER_E and ER_L are used within two control loops (e.g., using two loop filters) interwoven for tracking the phase and width parameters. In an embodiment, ER_E and ER_L are processed by track controller 210 using separate control paths (e.g., of the two control loops) for estimating a phase parameter 212 denoted 'P' corresponding to the phase error, and a width parameter 216 denoted 'W' corresponding to the estimated symbol width. Tracker 206 provides the phase and width parameters to sampler 204 for producing the D_E, D_M and D_L samples of the data symbols.

The control path for estimating the phase parameter P (212) comprises a loop filter comprising a subtractor 220, a configurable gain 224 having a gain parameter denoted 'K1', and a discrete-time integrator 228. Subtractor 220 calculates a difference error signal 232, which is amplified by K1 to produce an amplified difference error signal 236. Integrator 228 integrates the amplified difference error signal to produce the phase parameter P (with one cycle delay).

In general, a discrete-time integrator (e.g., integrators 228 and 248 of FIG. 4) calculates an output sample denoted y(n), by adding a previous output sample y(n−1) to the current input sample x(n). The transfer function of such a discrete-time integrator, in the Z domain, is given by $Y(z)=1/(1-Z^{-1})$. In the present model, x(n) models a sample of an error signal, and y(n) models a corresponding updated value of the phase parameter. The numerator in the transfer function of integrator 228 contains a $Z^{-1}$ element for preventing races in the loop.

The control path for estimating the width parameter W (216) comprises a loop filter comprising a Non-Linear Logic (NLL) module 240, a configurable gain 244 having a gain parameter denoted 'K2', and a discrete-time integrator 248. NLL 240 calculates a nonlinear error signal 252, which is amplified by K2 to produce an amplified nonlinear error signal 256. Integrator 248 integrates the amplified nonlinear error signal to produce the width parameter W (with one cycle delay).

In some embodiments, NLL 240 derives nonlinear error signal 252, from the early and late error signals ER_E and ER_L, as given by:

$$NL \text{ error signal} = \begin{cases} 1 & ER\_E = ER\_L = 0 \\ -1 & ER\_E \neq 0, ER\_L \neq 0 \\ 0 & \text{Otherwise} \end{cases} \quad \text{Equation 1}$$

In accordance with Equation 1, when both the early and late error signals are zeroed, the early and late samples D_E and D_L are likely to fall within the boundaries of the symbol, meaning that the parameter W is too small and needs to be increased. In this case NLL 240 outputs a positive value, e.g., '1'. When both the early and late error signals are nonzero, the early and late samples D_E and D_L are likely to fall outside the boundaries of the symbol, meaning that the parameter W is too large and needs to be decreased. In this case the NLL outputs a negative value, e.g., '−1'. When none of the two conditions above is met, the NLL outputs a zero value, in which case the value of the width parameter remains un-updated.

Figure 5:
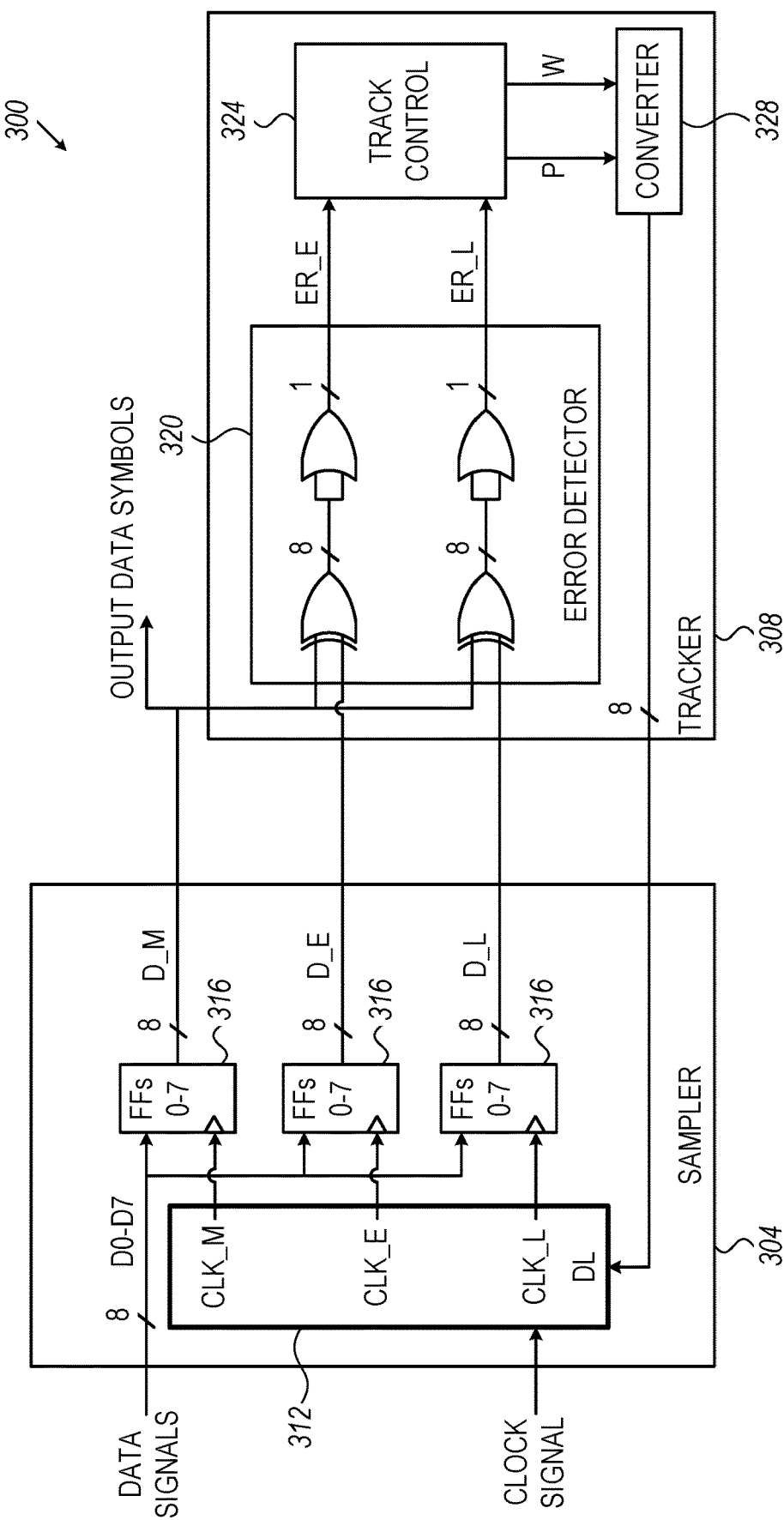
FIG. 5 is a block diagram that schematically illustrates a clock aligner, in accordance with another embodiment that is described herein.

FIG. 5 is a block diagram that schematically illustrates a clock aligner 300, in accordance with another embodiment that is described herein.

Clock aligner 300 comprises a sampler 304, and a tracker 308. Sampler 304 comprises a three-way Delay Line (DL) 312 and latches 316, each of which comprises eight digital flip-flop elements for latching eight bits denoted D0-D7 simultaneously.

DL 312 produces from an input clock signal separate sampling signals denoted CLK_E, CLK_M and CLK_L for sampling eight-bit data symbols conveyed in input data signals at three different instances. The early, middle, and late sampling signals (CLK_E, CLK_M and CLK_L, respectively) are used to sample the eight-bit data symbols using flip-flop elements 316 to produce respective early, middle, and late data samples denoted D_E, D_M and D_L. In the present example each of the data samples D_E, D_M and D_L comprises eight bits.

DL 312 may be implemented using any suitable configurable delay line method. In one embodiment, DL 312 comprises a single delay line having multiple outputs corresponding to different delays. Based on delay requirements determined by tracker 308, the sampler selects corresponding internal outputs of the DL to produce the sampling signals as described above. In another embodiment, DL 312 comprises three separate DLs, each of which delays the input clock signal by a respective required delay.

Tracker 308 comprises an error detector 320 and a track controller 324. Error detector 320 receives the data samples D_E, D_M and D_L, and produces from these data samples early error and late error signals denoted 'ER_E' and 'ER_L', respectively. In the present example, the error detector applies a bitwise logical XOR operation between the D_M and D_E to produce an 8-bit comparison result, and further applies a logical OR operation among the bits of the comparison result to produce a 1-bit ER_E signal. The error detector similarly produces the 1-bit ER_L signal based on comparing between D_M and D_L using another bitwise XOR operation.

Track controller 324 receives the error signals ER_E and ER_L, and based on these error signals, tracks both a phase parameter P and a symbol width parameter W, e.g., as described above with reference to track controller 210 of FIG. 4.

A converter 328 translates the phase error and symbol width parameters P and W into corresponding delay values to be applied to the input clock signal by DL 312. The translation of P and W into the delay values for the DL effectively combine the outputs of the corresponding loop filters P and W. In some embodiments, the converter determines the delay for the middle sampling signal based on the phase parameter P, and further determines the delays for the early and late sampling signals by determining delay values corresponding to W/2 time units shorter than and longer than the delay of the middle sampling signal.

In the example embodiment of FIG. 5, error detector 320 produce single-bit error signals ER_E and ER_R. This configuration, however, is not mandatory, and in alternative embodiments, multi-bit error signals ER_E and ER_L can also be used. For example, in an embodiment, the value of a multi-bit error signal corresponds to the number of bits differing between the early (or late) data sample and the middle data sample.

Tracking Phase Error and Symbol Width at the Transmitter

The embodiments described above refer mainly to tracking phase error and symbol width at the receiver side. Next are described embodiments in which tracking the phase error and symbol width are carried out at the transmitter side.

Figure 6A:
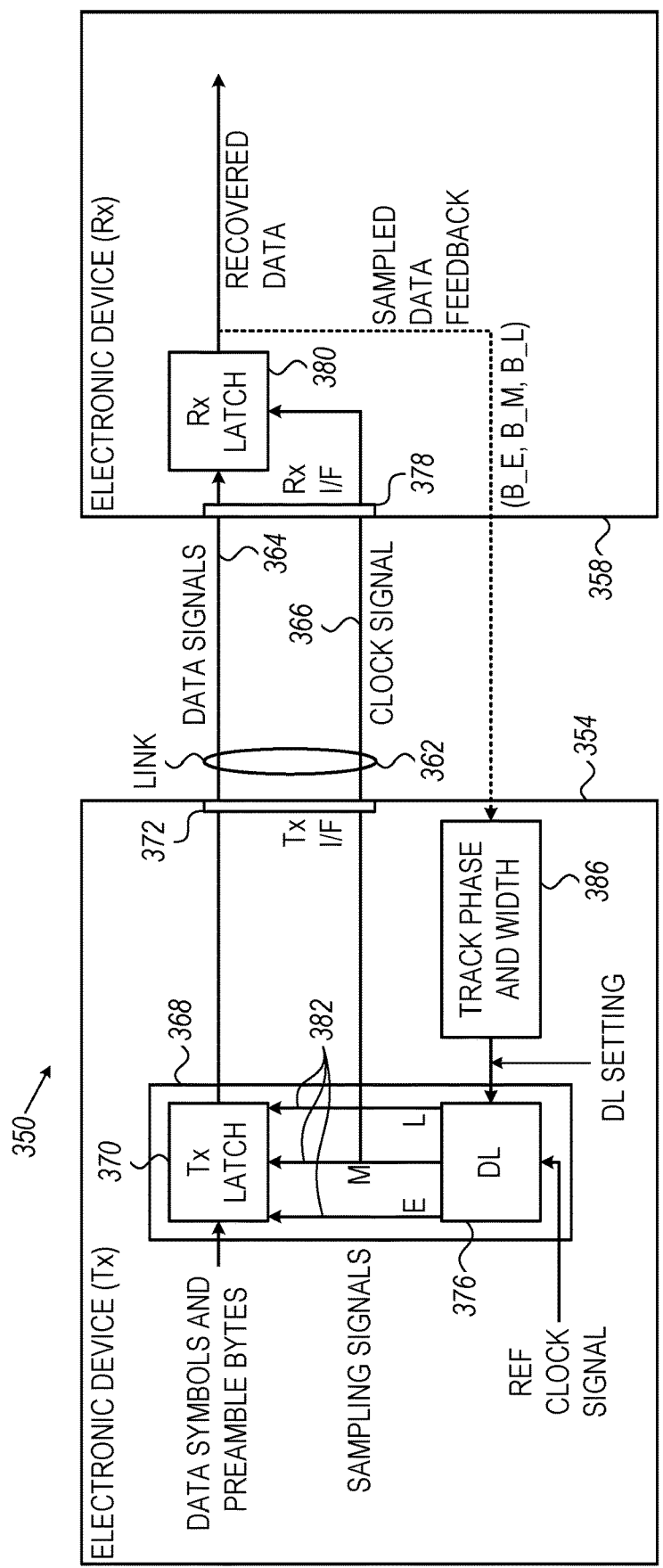
FIG. 6A is a block diagram that schematically illustrates a communication apparatus in which a transmitter aligns timing of a clock signal to data symbols by tracking both phase error and symbol width, in accordance with an embodiment that is described herein.

FIG. 6A is a block diagram that schematically illustrates a communication apparatus 350 in which a transmitter aligns timing of a clock signal to data symbols by tracking both phase error and symbol width, in accordance with an embodiment that is described herein.

Communication apparatus 350 comprises a transmitter electronic device 354 transmitting data signals to a receiver electronic device 358 over a link 362. The link comprises data lanes 364 and a clock lane 366 for transmitting the data signals and the clock signal, respectively. Clock signal 366 is derived from a reference clock signal by transmitter 354.

The transmitter comprises a sampler 368 comprising a Tx latch 370 and a DL 376. The Tx latch is coupled to link 362 via a transmitter interface 372. The Tx latch receives the data symbols and preamble bytes (e.g., from some data source—not shown), synchronized to a reference clock, and latches them using sampling signals 382 including an early, middle, and late sampling signals denoted 'E', 'M' and 'L', respectively. Specifically, the data symbols are latched using the M sampling signal, and early, middle, and late preamble bytes, denoted B_E, B_M and B_L, are latched using the E, M, and L sampling signals, respectively.

Although in the present example preamble bytes are used, in other embodiments, any suitable preamble symbols having a number of bits other than eight can also be used.

The data signals carrying the data symbols and preamble bytes, and the clock signal, propagate along the link to arrive via a receiver interface 378 at a Rx latch 380. The Rx latch latches data signals 364 using clock signal 366 to recover the data symbols and preamble bytes.

Receiver 358 sends the sampled preamble bytes B_E, B_M and B_L back to the transmitter, to be processed by a tracker 386, which tracks both phase error and symbol width. Tracker 386 produces a DL setting signal specifying the delays to be applied to the reference clock signal for producing respective sampling signals 382. In some embodiments, tracker 386 is implemented using tracker 206 of FIG. 4 or tracker 308 of FIG. 5.

Figure 6B:
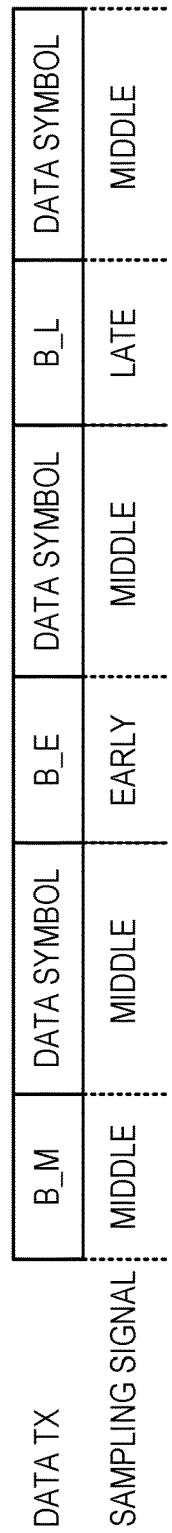
FIG. 6B is a timing diagram that schematically illustrates signals related to the transmitter of FIG. 6A, in accordance with an embodiment that is described herein.

FIG. 6B is a timing diagram that schematically illustrates signals related to the transmitter of FIG. 6A, in accordance with an embodiment that is described herein.

FIG. 6B depicts a sequence preamble bytes and data symbols sent by the transmitter to the receiver. In the present example each data page is preceded by a preamble byte. As seen, the transmitter latches the data symbols using the middle sampling signals. The preamble bytes B_E, B_M and B_L, however, are latched using respective early, middle, and late sampling signals.

An Example Method for Tracking Both Phase Error and Symbol Width

Figure 7:
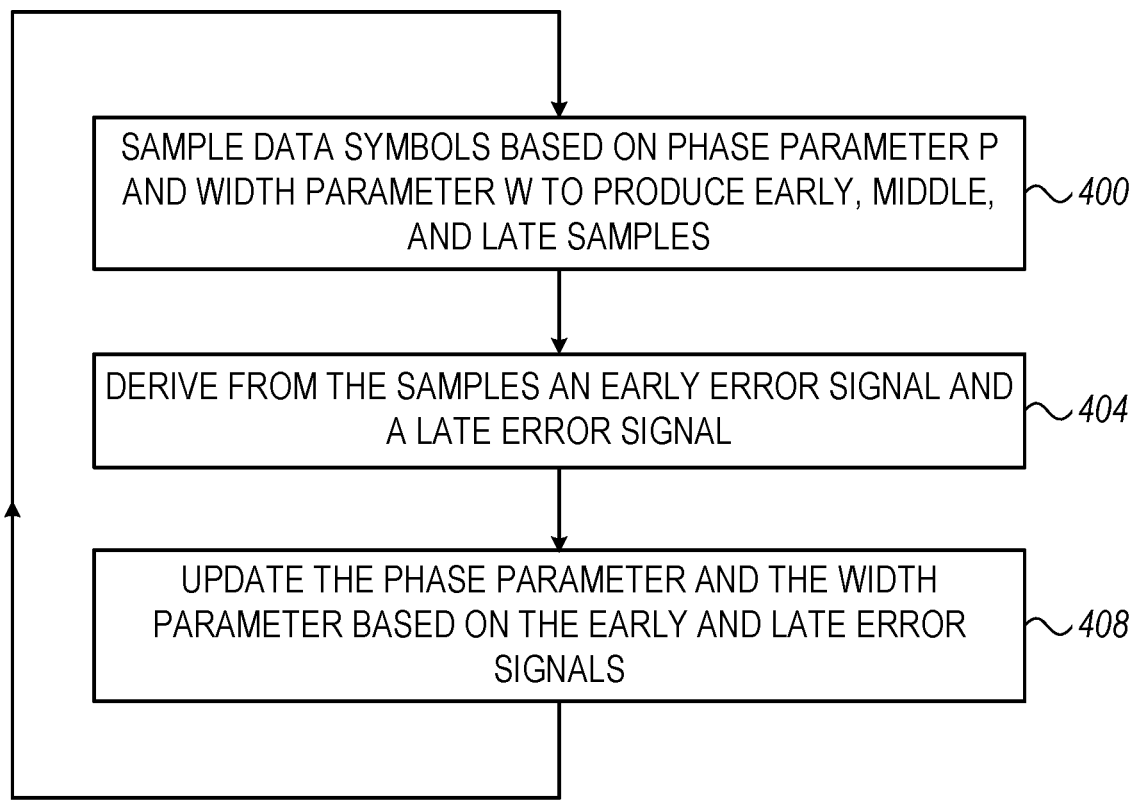
FIG. 7 is a flow chart that schematically illustrates a method for tracking both phase error and symbol width, in accordance with an embodiment that is described herein.

FIG. 7 is a flow chart that schematically illustrates a method for tracking both phase error and symbol width, in accordance with an embodiment that is described herein.

The method begins with sampler 204 sampling data symbols based on a phase parameter p (212) and a width parameter W (216) to produce early, middle, and late data samples, at a sampling step 400.

At an error derivation step 404, phase detector 208 produces from the data samples an early error signal ER_E and a late error signal ER_L.

At a parameter updating step 408, track controller 206 estimates updated values of the parameters P and W, e.g., using separate loop filters as described above. The method then loops back to step 400 to sample subsequent data symbols and preamble bytes based on the updated parameters.

The embodiments above are given by way of example and other suitable embodiments can also be used.

For example, in the embodiments described above, early and late error signals (e.g., in FIGS. 4 and 5) are calculated and used for tracking phase error and symbol width per clock cycle. This scheme is, however, not mandatory. In alternative embodiments the early and late error signals may be accumulated before being processed by the tracker controller. In such variant embodiments, the error signals ER_E and ER_L denote the accumulated error signals per sample.

In another alternative embodiment, each of the error signals may specify the actual number of errors encountered within the accumulation period, e.g., using a SUM operation instead of the logical OR in the error detector of FIG. 5. This embodiment corresponds to error accumulation across multiple data signals within a clock cycle. Alternatively, a binary error signal indicating at least a single error within the observation period (using the logical OR operation after the bitwise XOR operation in the error detector of FIG. 5).

In some embodiments, tracking the phase error and symbol width are carried out at the incoming data rate. Alternatively, the tracking may be done at a decimated rate. The decimation may be applied at the sampler that samples the data symbols, by reducing the rate updating the phase and error parameters, or both.

Although sampler (e.g., in FIG. 3) samples the data symbols within the same clock cycle, in other embodiments, the data symbols may be sampled at different clock cycles.

In some embodiments, the tracking loop is applied to a Double Data Rate (DDR) interface. In such embodiments, a single loop (e.g., such as tracker 206) may be used to track phase errors relative to both rising and falling edges of the clock signal. Alternatively, separate tracking loops may be implemented for the rising and falling edges of the clock signals.

The configurations of memory system 20 of FIG. 1, communication apparatuses 150 and 350 of FIGS. 3 and 6A, and clock aligners 200 and 300 of FIGS. 4 and 5 are shown purely for the sake of conceptual clarity. In alternative embodiments, any other suitable memory system, communication apparatus, and clock aligner configurations can also be used.

Elements in FIGS. 1 and 3-6A that are not necessary for understanding the principles of the present disclosure, such as various interfaces, addressing circuits, timing and sequencing circuits and debugging circuits, have been omitted from the figures for clarity.

In the example memory system configuration shown in FIG. 1, memory device 28 and memory controller 24 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Similar alternative architectures apply for transmitter electronic device 154 and receiver electronic device 158 of FIG. 3, and for transmitter electronic device 354 and receiver electronic device 358 of FIG. 6A.

Each of tracker 182 of FIG. 3, tracker 206 of FIG. 4, tracker 308 of FIG. 5, and tracker 386 of FIG. 6A may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

In some embodiments, one or more of tracker 182 of FIG. 3, tracker 206 of FIG. 4, tracker 308 of FIG. 5, and tracker 386 of FIG. 6A includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The embodiments described above are given by way of example and other suitable embodiments can also be used.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A receiver, comprising:
   an interface, configured to receive a sequence of data symbols, and further receive a clock signal for strobing the data symbols at selected positions of the data symbols;
   a delay line configured to produce from the clock signal a middle sampling signal, an early sampling signal that precedes the middle sampling signal, and a late sampling signal that succeeds the middle sampling signal; and
   circuitry, configured to:
      sample the data symbols using the middle sampling signal, the early sampling signal and the late sampling signal, to produce an early error signal and a late error signal;
      based on the early error signal and on the late error signal, configure the delay line to delay the middle sampling signal, the early sampling signal and the late sampling signal by separate respective delay values, so as to track both (i) a phase parameter indicative of a deviation between the middle sampling signal and the selected positions of the data symbols, and (ii) a width parameter indicative of a time duration of the data symbols; and
      output the data symbols strobed using the middle sampling signal,
      wherein the circuitry further comprises a width loop filter, and is further configured to track the width parameter by (i) applying a nonlinear function to the early error signal and the late error signal to produce a width error signal, and (ii) updating a value of the width parameter by applying the width loop filter to the width error signal.

2. The receiver according to claim 1, wherein the circuitry further comprises a phase loop filter, and is further configured to track the phase parameter by (i) calculating a difference signal between the early error signal and the late error signal, and (ii) updating a value of the phase parameter by applying the phase loop filter to the difference signal.

3. The receiver according to claim 1, wherein the circuitry is configured to determine a middle delay value for the middle sampling signal based on a value of the phase parameter.

4. The receiver according to claim 3, wherein the circuitry is configured to determine an early delay value for the early sampling signal by setting the early delay value to precede the middle delay value by half the updated value of the width parameter, and to determine a late delay value for the late sampling signal by setting the late delay value to succeed the middle delay value by half the updated value of the width parameter.

5. The receiver according to claim 1, wherein the circuitry is configured to produce the early error signal by comparing between a data symbol sampled using the early sampling signal and a data symbol sampled using the middle sampling signal, and to produce the late error signal by comparing between a data symbol sampled using the early sampling signal and a data symbol sampled using the middle sampling signal.

6. The receiver according to claim 1, wherein the receiver resides in a memory device coupled to a memory controller, and wherein the interface is configured to receive the sequence of data symbols and the clock signal while the memory controller writes data to the memory device.

7. The receiver according to claim 1, wherein the receiver resides in a memory controller coupled to a memory device, and wherein the interface is configured to receive the sequence of data symbols and the clock signal while the memory controller reads data from the memory device.

8. A method, comprising:
  in a receiver, receiving a sequence of data symbols, and further receiving a clock signal for strobing the data symbols at selected positions of the data symbols;
  producing from the clock signal a middle sampling signal, an early sampling signal that precedes the middle sampling signal, and a late sampling signal that succeeds the middle sampling signal;
  sampling the data symbols using the middle sampling signal, the early sampling signal and the late sampling signal, to produce an early error signal and a late error signal;
  based on the early error signal and on the late error signal, delaying the middle sampling signal, the early sampling signal and the late sampling signal by separate respective delay values, so as to track both (i) a phase parameter indicative of a deviation between the middle sampling signal and the selected positions of the data symbols, and (ii) a width parameter indicative of a time duration of the data symbols; and
  outputting the data symbols strobed using the middle sampling signal,
  wherein the receiver comprises a width loop filter, and wherein tracking the width parameter comprises (i) applying a nonlinear function to the early error signal and the late error signal to produce a width error signal, and (ii) updating a value of the width parameter by applying the width loop filter to the width error signal.

9. The method according to claim 8, wherein the receiver comprises a phase loop filter, and wherein tracking the phase parameter comprises (i) calculating a difference signal between the early error signal and the late error signal, and (ii) updating a value of the phase parameter by applying the phase loop filter to the difference signal.

10. The method according to claim 8, and comprising determining a middle delay value for the middle sampling signal based on a value of the phase parameter.

11. The method according to claim 10, and comprising determining an early delay value for the early sampling signal by setting the early delay value to precede the middle delay value by half the updated value of the width parameter, and determining a late delay value for the late sampling signal by setting the late delay value to succeed the middle delay value by half the updated value of the width parameter.

12. The method according to claim 8, wherein producing the early error signal comprises comparing between a data symbol sampled using the early sampling signal and a data symbol sampled using the middle sampling signal, and wherein producing the late error signal comprises comparing between a data symbol sampled using the early sampling signal and a data symbol sampled using the middle sampling signal.

13. The method according to claim 8, wherein the receiver resides in a memory device coupled to a memory controller, and wherein receiving the sequence of data symbols and the clock signal comprises receiving the sequence of the data symbols and the clock signal while the memory controller writes data to the memory device.

14. The method according to claim 8, wherein the receiver resides in a memory controller coupled to a memory device, and wherein receiving the sequence of data symbols and the clock signal comprises receiving the sequence of data symbols and the clock signal while the memory controller reads data from the memory device.

* * * * *